United States Patent [19]

Cline et al.

[11] 3,899,362

[45] Aug. 12, 1975

[54] THERMOMIGRATION OF METAL-RICH LIQUID WIRES THROUGH SEMICONDUCTOR MATERIALS

[75] Inventors: Harvey E. Cline; Thomas R. Anthony, both of Schenectady, N.Y.

[73] Assignee: General Electric Company, Schenectady, N.Y.

[22] Filed: Oct. 30, 1973

[21] Appl. No.: 411,018

[52] U.S. Cl. ................. 148/1.5; 148/171; 148/172; 148/173; 148/186; 148/187; 148/188; 148/179; 148/177; 252/62.3 GA; 252/62.3 E

[51] Int. Cl. ............................................. H01l 7/34

[58] Field of Search ..................... 148/1.5, 171–173, 148/186–188, 177, 179; 252/62.3 E, 62.3 GA

[56] References Cited

UNITED STATES PATENTS 2,813,048 11/1957 Pfann ..................................... 148/1

*Primary Examiner*—G. Ozaki

*Attorney, Agent, or Firm*—Donald M. Winegar; Joseph T. Cohen; Jerome C. Squillaro

[57] ABSTRACT

Liquid wires of metal-rich semiconductor material are migrated by a temperature gradient zone melting process through bodies of semiconductor material. Planar orientation of the surface through which thermomigration is initiated, directions of wire alignment in the surface, wire sizes and direction of wire migration are disclosed herein. P-N junctions produced behind the thermomigrated wires have substantially ideal breakdown voltage characteristics.

19 Claims, 4 Drawing Figures

PATENTED AUG 12 1975

3,899,362

THERMOMIGRATION OF METAL-RICH LIQUID WIRES THROUGH SEMICONDUCTOR MATERIALS

BACKGROUND OF THE INVENTION

1. Field of the Invention

This invention relates to the thermomigration of metal wires through bodies of semiconductor material and method of practicing the same.

2. Description of the Prior Art

W. G. Pfann describes in "Zone Melting," John Wiley and Sons, Inc., New York (1966) a traveling solvent method to produce P-N junctions within the bulk of a semiconductor material. In his method, either sheets or wires of a suitable metallic liquid are moved through a semiconductor material in a thermal gradient. Doped liquid-epitaxial material is left behind as the liquid wire mirgation progresses. For two decades, this process of temperature gradient zone melting has been practiced in an attempt to make a variety of semiconductor devices.

In our copending applications Method of Making Deep Diode Devices, Ser. No. 411,150 Deep Diode Device Production and Method, Ser. No. 411,021; Deep Diode Devices and Method and Apparatus, Ser. No. 411,001; High Velocity Thermomigration Method of Making Deep Diodes, Ser. No. 411,015, Deep Diode Device Having Dislocation-Free P-N Junctions and Method, Ser. No. 411,009; and The Stabilized Droplet Method of Making Deep Diodes Having Uniform Electrical Properties, Ser. No. 411,008, filed concurrently with this patent application and assigned to the same assignee of this application, we teach the stability of droplets, and planar zones as well as critical dimensions affecting the thermomigration thereof. However, we have found that even with this available knowledge, the thermomigration of metal wires through a body of semiconductor material is not a single adaptation of the available knowledge we had developed.

It has been discovered that one has to have a particular planar orientation of the surface of the body, a selected orientation of the direction of metal wires with respect to the planar orientation and to the axis of the cyrstal structure of the body along which thermomigration of the wires is practiced if one seeks to thermomigrate the wires a substantial distance into the material.

Therefore, it is an object of this invention to provide a new and improved method of thermomigrating metal wires through a body of semiconductor material.

Another object of this invention is to provide a new and improved method for thermomigrating metal wires through a body of semiconductor material which correlates planar orientation of the surface of the semiconductor materials, directions of wires as disposed on the surface and the direction of the thermomigration of the metal wires relative to the crytallography of the semiconductor material.

Other objects will, in part, be obvious and will, in part, appear hereinafter.

BRIEF DESCRIPTION OF THE INVENTION

In accordance with the teachings of this invention, there is provided a method for thermomigrating a metal wire through a body of semiconductor material. The method comprises the process steps of disposing a metal wire on a selected surface of a body of semiconductor material having a preferred planar crystal orientation. The vertical axis of the body is substantially aligned with a first axis of the crystal structure. The direction of the metal wire is oriented to substantially coincide with at least one of the other axis of the crystal structure. The body is heated to a temperature sufficient to form a liquid wire of metal-rich material on the surface of the body. A temperature gradient is established along substantially the vertical axis of the body and the first axis of the crystal structure. The metal-rich material is thermomigrated through the body along the first axis of the crystal structure to form a planar region of recrystallized material having solid solubility of the metal and/or dopant therein of the body. The planar region so formed may be of the same, or different type conductivity than that of the body. Planar orientation of the surface and wire directions therein for stable wire thermomigration is disclosed. Preferred wire sizes and their migration directions relative to planar orientation and wire directions are also disclosed herein. P-N junctions formed by this method in semiconductor materials have substantially ideal properties for the materials embodied therein.

DESCRIPTION OF THE INVENTION

Figures 1, 2, 3, 4:
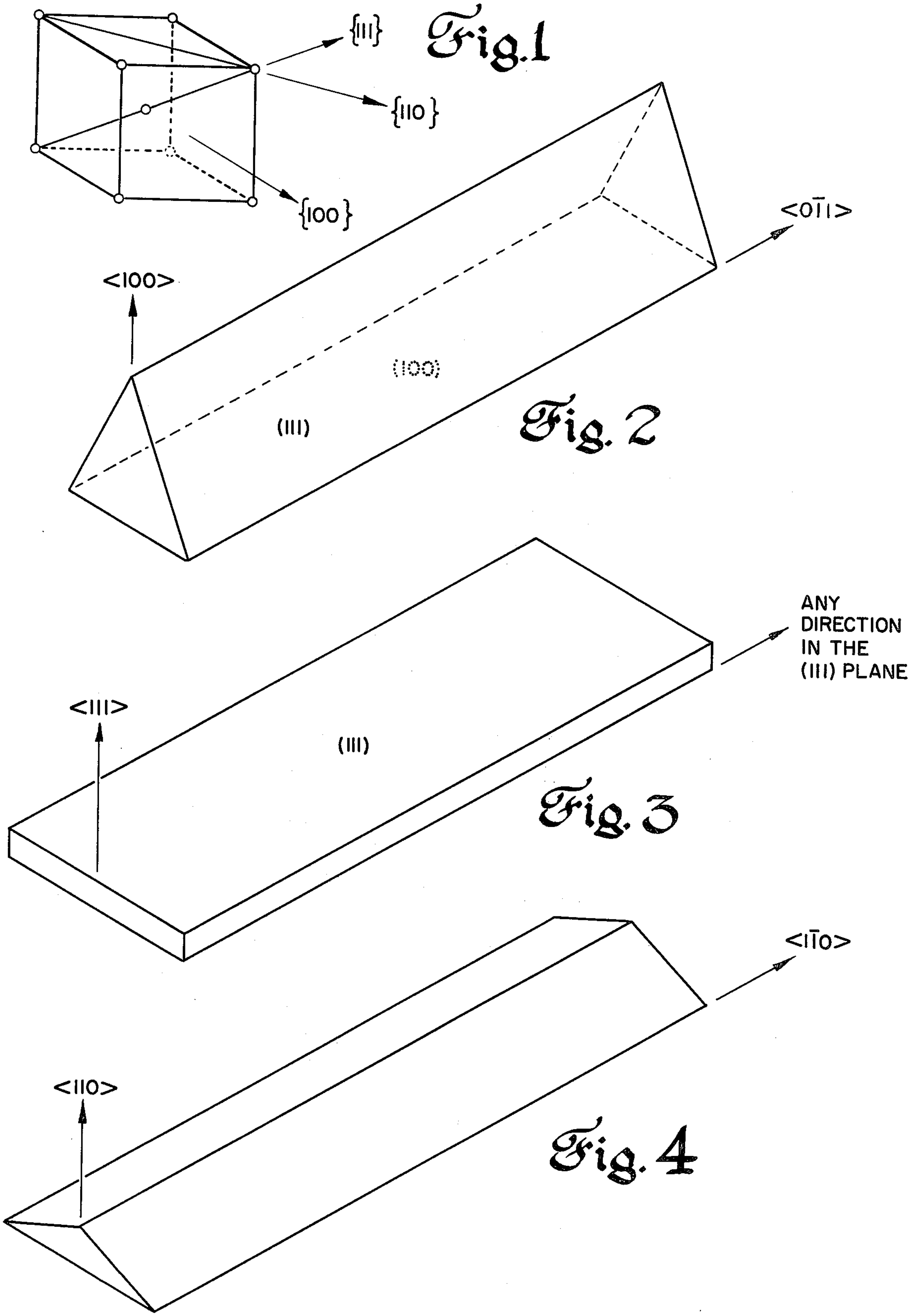
FIG. 1 is a diamond cubic crystal structure.
FIG. 2 is the morphological shape of wires which thermomigrate stably in the <100> direction.
FIG. 3 is the morphological shape of wires which thermomigrate stably in the <111> direction.
FIG. 4 is the morphological shape of wires which thermomigrate stably in the <110> direction.

With reference to FIG. 1, for the diamond cubic crystal structure of silicon, silicon carbide, germanium, and the like, stable wire thermomigration preferably is only practiced in bodies of semiconductor material having three particular orientations of the planar region of the surface of a body of semiconductor material. These selected or preferred planar regions are the (100) plane, (110) and the (111) plane. The (100) plane is that plane which coincides with a face of the unit cube. The (110) plane is that plane which passes through a pair of diagonally opposite edges of the unit cube. Those planes which pass through a cornor atom and through a pair of diagonally opposite atoms located in a face not containing the first mentioned atoms are generally identified as (111) planes. As a matter of convenience, directions in the unit cube which are perpendicular to each of these generic planes (XYZ) are customarily referred to as the "crystal zone axis" of the particular planes involved, or more usually as the "<XYZ>" direction.

Thus, the crystal zone axis of the (100) generic plane will be referred to as the <100> direction, the crystal zone axis of the (111) plane as the <111> direction, and to the crystal zone axis of the (110) plane as the <110> direction. Examples of these directions with respect to the unit cube are shown by the appropriately identified arrows in FIG. 1. In particular, for the (100) planar orientation, metal-rich wires can only be migrated stably in the <100> direction. In addition, only wires lying in the vertical <011> and the horizontal <0$\bar{1}$1> direction are stable in thermomigration in the <100> direction. The shape of these stable metal-rich wires is shown in FIG. 2. Solid-liquid surface tension causes coarsening of the ends of the stable metal-rich liquid wires.

Although lying in the same planar (100) region, wires of metal-rich liquid, lying in directions other than the $\langle 011\rangle$ and $\langle 0\bar{1}1\rangle$ directions are unstable and break up into a row of pyramidal square-base droplets of metal-rich liquid semiconductor material because of severe faceting of the solid-liquid interface of wires lying in these directions. Thus, for example, wires lying in the $\langle 012\rangle$ and $\langle 02\bar{1}\rangle$ directions are unstable.

The dimensions of the metal wires also influence the stability of the metal wires. Only metal wires which are no greater than approximately 100 microns in width are stable during the thermomigration of the wires in the $\langle 100\rangle$ direction for a distance of at least 1 centimeter into the body of semiconductor material. Wire stability increases with decreasing wire size. The more the size of the liquid metal wire exceeds 100 microns, the less the distance the liquid wire can penetrate during thermomigration before the wire becomes unstable and breaks up.

A critical factor influencing the liquid metal wire stability during thermomigration in the parallelism of the applied thermal gradient to either the $\langle 100\rangle$, $\langle 110\rangle$ or $\langle 111\rangle$ crystallographic directions. An off-axis component of the thermal gradient in general decreases the stability of the thermomigrating liquid wire by causing tooth-like facets to develop in the side faces of the wire. When the tooth-like facets become too large, the wire breaks up and loses its continuity.

The stability of wires lying in a (111) plane and migrating in a $\langle 111\rangle$ direction through a body of semiconductor material is not sensitive to the crystallographic direction of the wire. This general stability of wires lying in the (111) plane results from the fact that the (111) plane is the facet plane for the metal-rich liquid-semiconductor system. The morphological shape of a wire in the (111) plane is shown in FIG. 3 and the top and bottom surfaces are in the (111) plane. Therefore, both the forward and the rear faces of these wires are stable provided the wire does not exceed a preferred width.

The side faces of the wire lying in the (111) plane are not equally as stable as the top and bottom surfaces. Edges of the side faces lying in $\langle 1\bar{1}0\rangle$, $\langle 10\bar{1}\rangle$ and the $\langle 01\bar{1}\rangle$ directions have (111) type planes as side faces. Consequently, these wires are stable to any sideways drift that may be generated by any component of the thermal gradient not substantially aligned along the $\langle 111\rangle$ axis. Other wire directions in the (111) plane such, for example, as the $\langle 11\bar{2}\rangle$ wire direction develop serration on their side faces if they drift sideways as a result of a slightly off axis thermal gradient. Eventually, the continuing migrating wire breaks up completely or bends into a $\langle 1\bar{1}0\rangle$ type line direction. Therefore, a reasonably well aligned thermal gradient permits thermal migrataion of $\langle 11\bar{2}\rangle$ direction wires through bodies of semiconductor material 1 centimeter in thickness by the temperature gradient zone melting process before either breaking up of the wire or the occurrence of serrations of the edges of the migrating wire.

In thermal migrating liquid wires through bodies of semiconductor material having an initial (111) wafer plane, the most stable wire directions are $\langle 01\bar{1}\rangle$, $\langle 10\bar{1}\rangle$ and $\langle 1\bar{1}0\rangle$. The width of each of these wires may be up to approximately 500 microns and still maintain stability during thermal migration.

Any other wire direction in the (111) plane not disclosed heretofore may be thermomigrated through the body of semicondutor material. However, the wires of these wire directions have the least stability of all the wire directions of the (111) plane in the presence of an off axis thermal gradient. Wires of a width up to 500 microns are stable during thermomigration for all wires lying in the (111) plane regardless of wire direction.

We have found that only one wire direction produces a stable wire for migration in the $\langle 110\rangle$ axis. This wire direction is the $\langle 1\bar{1}0\rangle$ direction on a (110) plane surface. The morphological shape of the stable wire is shown in FIG. 4.

The following examples illustrate the teachings of this invention:

EXAMPLE I

One inch diameter, 1 centimeter thick, N-type, 10 ohm-centimeter single crystal body of silicon with $\langle 100\rangle$ axial orientation was lapped, polished, cleaned and a layer of silicon oxide grown on a (100) planar surface. A radial sun pattern of lines was etched through the overlying oxide during photolithographical techniques and selective etching. Employing the silicon oxide as a mask, the lines of the radial sun pattern were etched to a depth of 20 microns into the bulk silicon. A 20 micron thick aluminum film was deposited from an electron beam source into the line pattern etched in the silicon. The aluminum was 99.9999 percent pure. The excess aluminum overlaying the silicon oxide mask was ground off employing 600 grit paper leaving the etched line pattern grooves filled with aluminum to form the metal wires for thermomigration.

The prepared body of silicon was placed in an electron beam thermomigration apparatus. A substantially uniform vertical temperature gradient along the $\langle 100\rangle$ axis was produced and maintained to thermomigrate the wires through the body of silicon. The thermal gradient was 50°C per centimeter at a furnace temperature of 1200°C at a pressure of $1 \times 10^{-5}$ torr. The wires were thermomigrated through the body of silicon in less than 12 hours.

Upon completion of the thermomigration of the metal wires, the furnace was cooled and the body of silicon was prepared for examination. Examination of the body showed that only wires lying in the $\langle 011\rangle$ and the $\langle 0\bar{1}1\rangle$ directions are stable for thermomigration in the $\langle 100\rangle$ axis. Examination of these thermomigrated wires clearly showed coarsening of the ends of the wires as a result of solid-liquid surface tension.

Metal wires lying in the $\langle 011\rangle$ and $\langle 010\rangle$ directions were unstable and broke up into a row of pyramidal square-base droplets after thermomigration of only 3 millimeters into the silicon body. Severe faceting of the solid-liquid interface of the wires lying in these directions was observed.

EXAMPLE II

A second body of silicon of the same size and crystal orientation was prepared as in Example I except that an array of lines varying in diameter from 50 to 200 microns was disposed along the $\langle 011\rangle$ direction of the (100) planar surface of the body. Thermomigration of the wires was practiced in the same manner as before.

Examination of the body of silicon after processing showed that only wires below approximately 100 microns in diameter were stable. However, thicker lines could be thermomigrated but only for shorter distances of up to 3 to 4 times the wire thickness into the body of silicon.

EXAMPLE III

The experiment of Example I was repeated except the body of silicon had a <111> crystal orientation and the wires lay in the (111) planar region.

The results of the experiment indicated that wires lying in a (111) plane and migrating in a <111> direction were stable. The general stability of the wires results from the fact that the (111) plane is the facet plane in the aluminum-rich liquid-silicon system. Both the forward and the rear faces of the wires are stable provided the wire is not too thick.

Wire directions $\langle 01\bar{1}\rangle$, $\langle 10\bar{1}\rangle$ and $\langle 1\bar{1}0\rangle$ were found to be the most stable during thermomigration and the least affected if the thermal gradient was not substantially aligned with the <111> axis of migration. Wire directions, $\langle 11\bar{2}\rangle$, $\langle \bar{2}11\rangle$ and $\langle 1\bar{2}1\rangle$ were the next most stable. The remainder of the wires directions are the least stable and the most affected by a thermal gradient not being substantially aligned with the <111> axis. Wires of less than approximately 500 microns are successfully thermomigrated through 1 centimeter thick bodies of silicon.

The Table summarizes the wire directions, thermomigration directions, wire shapes and wire sizes that allow the stable thermomigration of aluminum-rich liquid wires through bulk silicon.

Table

| Wafer Plane | Migration Direction | | Stable Wire Directions | Stable Wire Sizes |
|---|---|---|---|---|
| (100) | <100> | | <011>* | <100 microns |
| | | | $\langle 0\bar{1}1\rangle$* | <100 microns |
| (110) | <110> | | $\langle 1\bar{1}0\rangle$* | <150 microns |
| (111) | <111> | (a) | $\langle 01\bar{1}\rangle$ | |
| | | | $\langle 10\bar{1}\rangle$ | <500 microns |
| | | | $\langle 1\bar{1}0\rangle$ | |
| | | (b) | $\langle 11\bar{2}\rangle$* | |
| | | | $\langle \bar{2}11\rangle$* | <500 microns |
| | | | $\langle 1\bar{2}1\rangle$* | |
| | | (c) | Any other * Direction in (111) plane* | <500 microns |

*The stability of the migrating wire is sensitive to the alignment of the thermal gradient with the <100>, <110> and <111> axis, respectively.
+Group a is more stable than group b which is more stable than group c.

In a similar manner, other metal wires can be thermomigrated through silicon, germanium and silicon carbide. The process finds particular applications in the semiconductor art wherein planar regions are produced in bodies of semiconductor material. In particular, by the employment of suitable metals, planar regions having selected resistivity and selected type conductivity are produced in bodies of semiconductor material. The material of these planar regions is recrystallized material of the body in which the thermomigration is practiced and contains solid solubility of the metal therein. Aluminum wires migrated through N-type silicon produce planar regions of P-type conductivity. A P-N junction is formed by the continuous surfaces of the N-type silicon and the P-type silicon. The P-N junction is well defined and 75 a step junction. The resistivity of the regions so formed is $8 \times 10^{-3}$ ohm-centimeter.

The resistivity of the P-type regions may be decreased by thermomigrating a metal wire of tin-aluminum through the semiconductor material. Tin does not affect the conductivity of the material. The resistivity of the region can be selected by varying the composition of the tin-aluminum wire.

In a like manner, metal wires of gold-antimony thermomigrated through a N-type silicon will form an N-type planar region, the resistivity of which is dependent on the amount of antimony present in the wire initially.

Although we have described the preferred line directions, planar orientations and axis of thermomigration, one may thermomigrate metal wires in any direction for any of the planar regions disclosed. However, the distance they thermomigrate is limited and varies. But one may successfully practice the invention for these other wire directions provided the body of semiconductor material is only about the usual thickness of normal wafers employed in the semiconductor industry.

In addition to the preferred wire directions for the different planar orientations, we have discovered that any wire direction for the three planar orientations will migrate satisfactorily through a thin body of semiconductor material. The thin body preferably should not be greater than three or four times the preferred thickness of the layer of metal deposited on the surface of the body for the thermomigration therethrough. Therefore, for the thermomigration of aluminum through a thin body of silicon, the body should not be greater than approximately 100 microns in thickness.

In addition, thicker wires than the ones disclosed in the Table as being preferred, may be thermomigrated through a thin body of semiconductor material. It has been found that metal wires may be thermomigrated through a body of semiconductor material which has a thickness of from 3 to 4 times the thickness of the actual wire thermomigrated therethrough. It has also been discovered that the thermomigration of these metal wires may be practiced successfully because the wires do not have the sufficient distance of travel necessary to break up the liquid wire.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon and the like in a furnace having a positive atmosphere.

We claim as our invention:

1. A method for migrating a vapor deposited metal wire through a body of semiconductor material comprising the process steps of:

a. selecting a body of semiconductor material so that the body has at least one surface having a preferred planar crystal structure orientation, the vertical axis of the body being substantially aligned with a first axis of the crystal structure;

b. etching selectively the surface having the preferred planar crystal structure orientation to form at least one trough-like depression in the surface in a preferred crystal wire direction which is oriented to substantially coincide with at least one of the other axes of the crystal structure;

c. vapor depositing a layer of a metal in the at least one trough-like depression on the selected surface of the body of semiconductor material;

d. heating the body and the metal to a temperature sufficient to form a liquid wire of metal-rich material in each of the trough-like depressions on the surface of the body;

e. establishing a temperature gradient along substantially the vertical axis of the body and the first axis of the crystal structure, and f. migrating the metal-rich liquid wire through the body along the first axis of the crystal structure to form a planar region of recrystallized material of the body having solid solubility of the metal of the wire therein to impart a selected type conductivity and a selected level of a resistivity thereto.

2. The method of claim 1 wherein
the material of the body is one selected from the group consisting of silicon, silicon carbide, gallium arsenide and germanium.

3. The method of claim 2 wherein
the material is silicon having N-type conductivity, and
the metal of the wire is aluminum.

4. The method of claim 3 wherein
the temperature gradient is 50°C per centimeter, and
the migration is practiced at a temperature of 1200°C.

5. The method of claim 2 wherein
the preferred planar crystal orientation is (110);
the at least one trough-like depression is oriented in a $\langle 1\bar{1}0\rangle$ direction, and
the orientation along which migration is practiced is the $\langle 110\rangle$ axis.

6. The method of claim 5 wherein
the metal-wire size is no greater than approximately 150 microns.

7. The method of claim 2 wherein
the preferred planar crystal orientation is (100),
the at least one trough-like depression is oriented in one of the directions of the crystal structure axes of the group consisting of $\langle 011\rangle$ and $\langle 0\bar{1}1\rangle$,
the direction of the first axis along which migration is practiced is $\langle 100\rangle$.

8. The method of claim 7 wherein
the metal-wire size is no greater than approximately 100 microns.

9. The method of claim 2 wherein
the preferred planar crystal orientation is (111),
the at least one trough-like depression is oriented in a direction which is any one of the wire directions in the (111) planar region, and
the direction of the first axis along which the migration is practiced is $\langle 111\rangle$.

10. The method of claim 9 wherein
the at least one trough-like depression is oriented in a direction which is one selected from the group consisting of $\langle 01\bar{1}\rangle$, $\langle 10\bar{1}\rangle$ and $\langle 110\rangle$.

11. The method of claim 9 wherein
the at least one trough-like depression is oriented in a direction which is one selected from the group consisting of $\langle 11\bar{2}\rangle$, $\langle \bar{2}11\rangle$, and $\langle 1\bar{2}1\rangle$.

12. The method of claim 9 wherein
the semiconductor material is silicon having N-type conductivity, and
the metal of the vapor deposited wire is aluminum.

13. The method of claim 9 wherein
the metal-wire size is no greater than approximately 500 microns.

14. The method of claim 1 wherein
the preferred planar crystal orientation is (100);
the at least one trough-like depression is oriented in any direction;
the direction of the first axis along which migration is practiced is $\langle 100\rangle$, and
the thickness of the body is from 3 to 4 times the thickness of the metal wire.

15. The method of claim 1 wherein
the preferred planar crystal orientation is (100);
the at least one trough-like depression is oriented in any direction;
the direction of the first axis along which migration is practiced is $\langle 100\rangle$, and
the thickness of the body is not greater than approximately 100 microns.

16. The method of claim 1 wherein
the preferred planar crystal orientation is (111);
the at least one trough-like depression is oriented in any direction;
the direction of the first axis along which migration is practiced is $\langle 111\rangle$, and
the thickness of the body is from 3 to 4 times the thickness of the metal wire.

17. The method of claim 1 wherein
the preferred planar crystal orientation is (111);
the at least one trough-like depression is oriented in any direction;
the direction of the first axis along which thermomigration is practiced is $\langle 111\rangle$, and
the thickness of the body is not greater than approximately 100 microns.

18. The method of claim 1 wherein
the preferred planar crystal orientation is (110);
the at least one trough-like depression is oriented in any direction;
the direction of the first axis along which migration is practiced is $\langle 110\rangle$, and
the thickness of the body is from 3 to 4 times the thickness of the metal wire.

19. The method of claim 1 wherein
the preferred planar crystal orientation is (110);
the at least one trough-like depression is oriented in any direction;
the direction of the first axis along which migration is practiced is (110), and
the thickness of the body is not greater than approximately 100 microns.

* * * * *